United States Patent [19]

Bittebierre et al.

[11] Patent Number: 5,192,877
[45] Date of Patent: Mar. 9, 1993

[54] HALL EFFECT SENSOR AND COMPONENT PROVIDING DIFFERENTIAL DETECTION

[75] Inventors: Jean Bittebierre, Campagne des Granges; Philippe Biton, Caluire, both of France

[73] Assignee: l'Electricfil Industrie, France

[21] Appl. No.: 707,059

[22] Filed: May 29, 1991

[30] Foreign Application Priority Data

May 30, 1990 [FR] France .................. 90 06966

[51] Int. Cl.$^5$ .................. H03K 17/90; H03K 5/22
[52] U.S. Cl. .................. 307/309; 307/278; 307/355; 328/1; 328/5; 338/32 R; 338/32 H; 324/251; 324/207.2
[58] Field of Search .................. 307/278, 309, 355; 328/1, 5; 338/32 R, 32 H; 324/251, 207.2

[56] References Cited

U.S. PATENT DOCUMENTS

| | | | |
|---|---|---|---|
| 3,789,311 | 1/1974 | Masudo | 307/309 |
| 3,800,193 | 3/1974 | Ashar et al. | 317/235 R |
| 4,123,772 | 10/1978 | Janssen | 307/309 |
| 4,518,918 | 5/1985 | Avery | 324/208 |
| 4,829,248 | 5/1989 | Loubier | 307/309 |
| 4,859,941 | 8/1989 | Higgs et al. | 324/251 |
| 5,045,920 | 9/1991 | Vig et al. | 324/207.2 |

FOREIGN PATENT DOCUMENTS 0319737  6/1989  European Pat. Off.

OTHER PUBLICATIONS

IBM Technical Disclosure Bulletin, vol. 28 #10 Mar. 1986, New York, pp. 4498-4499 "Magnetoresistive Sensing of Print Actuators".

Primary Examiner—William L. Sikes
Assistant Examiner—Margaret R. Wambach
Attorney, Agent, or Firm—Bacon & Thomas

[57] ABSTRACT

As a component belonging to a class of components having hysteresis cycles of similar characteristics, the component of the invention subjects group of probes, in the absence of field-disturbing members situated in relationship with the probes, to a determined induction field so that a "bias" induction difference ($B_O$) appears between the two groups, which difference is not less than the value of the high switchover threshold ($B_H$), or not greater than the value of the low switchover threshold ($B_B$), or else lies between the switchover thresholds ($B_H$ and $B_B$), thereby obtaining a signal in a determined logic state at the output from the hysteresis level comparator in spite of induction difference dispersions lying between the minimum value of the low threshold ($B_{Bmin}$) and the maximum value of the high threshold ($B_{Hmax}$). The invention is applicable to differential detection Hall effect sensors.

18 Claims, 4 Drawing Sheets

HALL EFFECT SENSOR AND COMPONENT PROVIDING DIFFERENTIAL DETECTION

The present invention relates to the technical field of Hall effect sensors and it relates, more particularly, to components including at least two Hall effect probes or cells making it possible to implement methods of differential measurement.

BACKGROUND OF THE INVENTION

Prior art components exist including two Hall effect probes or cells each constituted by a bar made of silicon, gallium arsenide, or indium antimonide, for example, into which an electrical current is injected. The bars are subjected to a magnetic induction field generally created by a permanent magnet such that a so-called "Hall" electrical voltage appears across the terminals of each bar.

This type of sensor constituted by associating a magnet with such a component serves to detect variation in the magnetic induction as appears, in particular, whenever an item having field-disturbing members moves past the probes. The moving item may be constituted, for example, by a toothed wheel. Such a sensor therefore serves to monitor positions and displacements and numerous applications are found therefor, in particular in the motor industry where such a sensor may be used, for example, to perform ignition functions or in antilock braking.

Development in integrated circuit technology has made it possible to provide components in the form of an integrated circuit having two probes that are a few millimeters apart, together with electronic processing stages associated with the probes. As can be seen in FIG. 1, Hall effect probes 1, 2 are connected to a differential amplifier 3 whose output is applied to a hysteresis comparator 4 such as a Schmitt trigger, as is well known per se. The probes 1, 2, the amplifier 3, and the comparator 4 are powered by an electrical voltage which is regulated by appropriate means 5.

The comparator 4 delivers a signal V via an output stage 6, which signal is representative of the difference in the induction detected by the probes 2 and 1 respectively, i.e. $B = B_2 - B_1$. As can clearly be seen in FIG. 2, the output signal V takes up a determined logic state, e.g. high, whenever the induction difference B between the two probes 1 and 2 is greater than the value of a high switchover threshold $B_H$. The comparator 4 delivers an output signal having the complementary logic state (low in the example shown) whenever the induction difference B is less than a low switchover threshold $B_B$. The operation of such a sensor thus presents a hysteresis cycle making it possible to obtain unambiguous transitions in the output voltage V for normal values of the induction ($B_H$ and $B_B$) depending on whether it is increasing or decreasing, respectively.

Such components suffer from a major drawback in that they have relatively high manufacturing dispersion with respect to how the hysteresis cycle is determined, i.e. the switchover thresholds $B_H$ and $B_B$. As can be seen clearly in FIG. 2, the value of the high switchover threshold $B_H$ may lie between values $B_{Hmax}$ and $B_{Hmin}$, while the value of the low switchover threshold $B_B$ may lie in the range $B_{Bmax}$ to $B_{Bmin}$.

Component manufacturing dispersion means that the outputs of different manufactured sensors do not take up a determined and reproducible logic state in the presence and in the absence of disturbing members to be detected. Such components cannot therefore be used directly in mass production of sensors including a magnet assembled to the component by means of glue, for example, without there being an increase in the cost of such a sensor due to specific operations that need to be performed in the assembly of each sensor.

In addition, another drawback of sensors of this type lies in the fact that their operation depends on the induction which appears at the surface of the magnet associated with each sensor being uniform, and in practice this is difficult to obtain.

The present invention therefore seeks to solve the above-mentioned drawbacks by providing a differential detection Hall effect component designed to compensate for the manufacturing dispersion that appears on the switchover thresholds which determine the hysteresis cycle in the operation of the level comparator associated with such a component.

The invention also seeks to provide a differential detection Hall effect sensor suitable for presenting magnetic induction at the surface of the magnet which is uniform or quasi-uniform.

The invention also seeks to provide a differential detection Hall effect sensor designed to retain the detection properties of large air gap sensors.

SUMMARY OF THE INVENTION

To achieve the above-specified objects, the present invention provides a differential detection Hall effect component of the type comprising first and second groups of Hall effect probes spaced apart from each other and subjected to an induction field created, in particular, by at least one permanent magnet and placed in a distance relationship with a moving item provided with field-disturbing members such that the groups which are associated in differential mode deliver a signal representative of the detected induction difference and applied to a hysteresis level comparator suitable for delivering firstly a signal in a first logic state for a detected induction difference greater than a high switchover threshold and secondly a complementary logic signal in a second logic state for a detected induction difference less than a low switchover threshold. As a component belonging to a class of components having hysteresis cycles of similar characteristics, the component of the invention includes means for subjecting the group of probes, in the absence of field-disturbing members situated in relationship with the probes, to a determined induction field so that a "bias" induction difference appears between the two groups, which difference is not less than the value of the high switchover threshold, or not greater than the value of the low switchover threshold, or else lies between the switchover thresholds, thereby obtaining a signal in a determined logic state at the output from the hysteresis level comparator in spite of induction difference dispersions lying between the minimum value of the low threshold and the maximum value of the high threshold.

Advantageously, the means for applying a bias induction difference to the groups are constituted by a pole piece assembly delimiting and/or forming firstly a first zone associated with the first group and having determined magnetic permeability, and secondly a second zone contiguous with the first zone and placed in association with the second group, and having given magnetic permeability different from that of the first zone, thereby obtaining the bias induction difference between the two groups of probes.

BRIEF DESCRIPTION OF THE DRAWINGS

Embodiments of the invention are described by way of example with reference to the accompanying drawings, in which.

DETAILED DESCRIPTION

Figure 3:
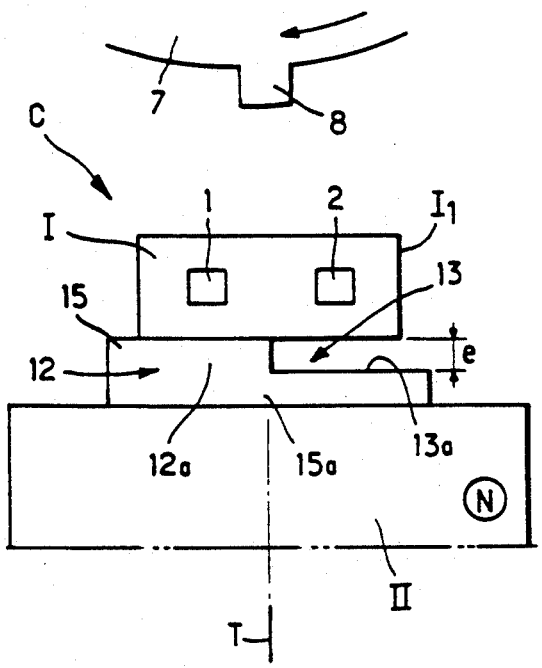
FIG. 3 is a diagram showing one embodiment of a Hall effect sensor of the invention.
Figure 4:
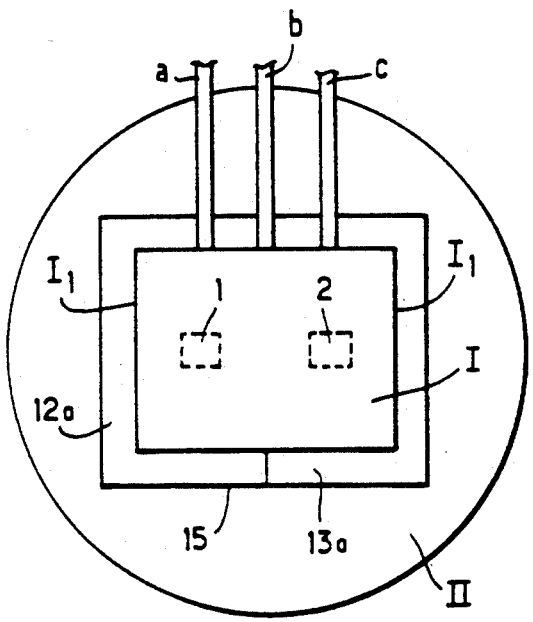
FIG. 4 is a plan view of the sensor shown in FIG. 3.

In the embodiment shown in FIGS. 3 and 4, a Hall effect sensor C comprises firstly a component I such as an integrated circuit which may be generally in the form of a rectangular solid, and secondly by a magnet II. The component I includes first and second groups 1, 2 of Hall effect probes or cells with the groups being separated from each other by a distance of a few millimeters. Depending on the intended application, each group 1, 2 comprises a given number of Hall effect probes (not less than two) enabling temperature drift to be compensated. Each probe is preferably formed in an integrated circuit made of silicon or of gallium arsenide. The probes are subjected to a magnetic induction field, created, for example, by means of at least one magnet II, e.g. a cylinder of circular section and constituted in the example shown by a north pole N about an axis of symmetry T.

Figure 1:
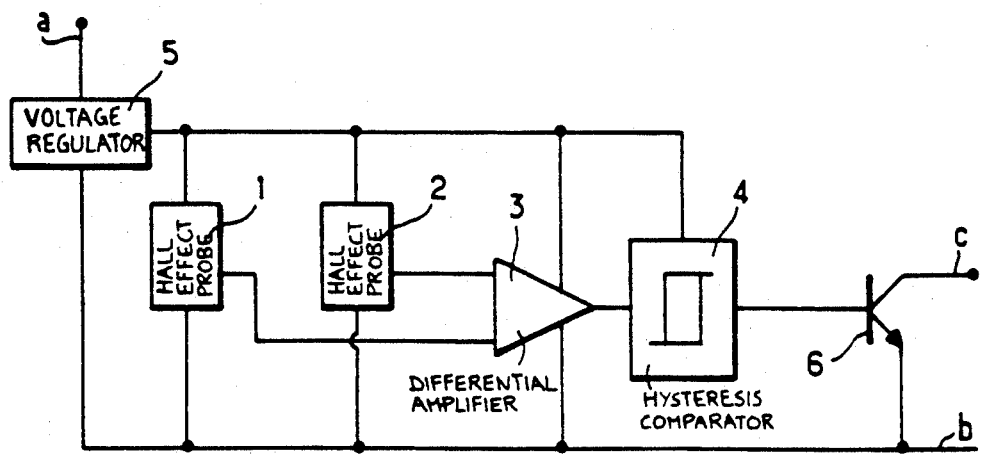
FIG. 1 is a block diagram of a prior art differential detection Hall effect sensor.

The integrated circuit also includes the electronic processing stages 3 to 6 as shown in FIG. 1 and having the functions described above. The integrated circuit is fitted with two power supply connections a and b, together with an output connection c for the voltage V delivered by the component I whose output varies in the manner shown in FIG. 2. The voltage V is thus representative of variation in the induction difference $B = B_2 - B_1$ as detected respectively by the two groups 2 and 1 and as appears whenever and item 7 provided with field-disturbing members 8 passes the sensor C.

According to the invention, the sensor C includes means that in the absence of the distrubing members 8 situated in engagement with the probes serve to subject the two groups of probes 1, 2 to an induction field in such a manner as to ensure that a "bias" induction difference $B_O$ appears between the groups of probes 1 and 2. This bias induction difference is selected for a class or family of components having hysteresis cycles of characteristics that are similar with respect to positioning, in such a manner as to be either not less than the value of the high switchover threshold $B_H$, or not more than the level of the low switchover threshold $B_B$, or else to lie between the high and low thresholds $B_H$ and $B_B$ of the hysteresis cycle of the components in the class. By applying such a bias induction difference $B_O$ to the groups of probes 1 and 2, it is possible to place the output of the comparator 4 in a determined logic state regardless of the manufacturing dispersion that occurs in the determination of the switchover thresholds $B_B$ and $B_H$ which may lie respectively in the range $B_{Bmax}$ to $B_{Bmin}$ and in the range $B_{Hmax}$ to $B_{Hmin}$.

It should be observed that when the induction value $B_O$ is chosen to lie between the values $B_B$ and $B_H$, it is possible to obtain signals at complementary levels depending on the direction of rotation of the item carrying the field-disturbing members, thereby making it possible to detect the direction in which said item is rotating.

In a first embodiment, the means for establishing bias induction difference are constituted by a set of pole pieces delimiting a first zone 12 associated with the first group 1 of probes and having determined magnetic permeability. The set of pole pieces also delimits a second zone 13 contiguous with the first zone 12, placed in association with the second group 2 of probes, and having given magnetic permeability different from that of the first zone, thereby obtaining the bias induction difference $B_O$ between the two groups of probes 1 and 2.

In the embodiment shown in FIGS. 3 and 4, the set of pole pieces is constituted by a single pole piece 15 preferably made of a ferro- or ferrimagnetic material and interposed between the integrated circuit I and the magnet II, being connected both to the integrated circuit and to the magnet by any appropriate means, e.g. gluing or mechanical assembly. The permeability of the pole piece 15 is uniform, but its shape is asymmetrical. Thus, the pole piece 15 has a base 15a whose dimensions in plan view are preferably significantly greater than the dimensions of the integrated circuit, thereby enabling the pole piece to project beyond each of the edges (vertical in the figure) $I_1$ of the integrated circuit, as can clearly be seen in FIG. 4. The pole piece 15 also includes a projecting portion 12a standing proud of the base 15a and corresponding, for example, to the first zone 12 placed in association or immediately beneath the first group of probes 1. The pole piece 15 is shaped to have a cut-out 13a constituting the second zone 13 which is placed in association with or immediately beneath the second group 2 of probes. The cut-out 13a thus constitutes a magnetic discontinuity in the pole piece 15 of determined thickness e, thereby enhancing passage of the induction field through the group of probes 1 (in the example shown), thus obtaining the desired bias induction difference $B_O$.

It thus appears possible, starting with batches of components sorted by family or by class, to adjust this continuity and in particular the thickness of the cut-out so that the value of the induction between the bias induction $B_O$ and the hysteresis cycle of the component under consideration remains substantially identical from one component to another.

Figure 5:
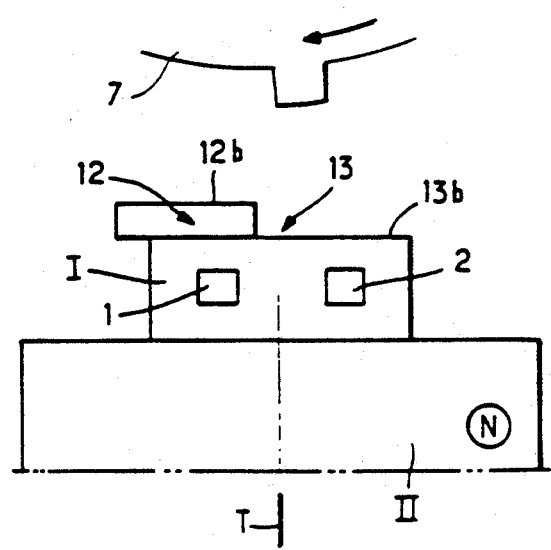
FIG. 5 is an elevation view of a variant embodiment of a sensor of the invention.

FIG. 5 shows a variant embodiment of the invention in which the pole piece assembly is placed between the component I and the moving item 7. In this variant, the pole piece assembly is constituted by a pole piece 12b placed on the integrated circuit, e.g. in association with the group of probes 1 so as to constitute the first zone 12. The pole piece 12b delimits an adjacent empty space 13b constituting the second zone 13 of the pole piece assembly.

Naturally, the pole piece assembly as described with reference to the variants shown in FIGS. 3 to 5 could be formed directly inside the sensor. In addition, the pole piece assembly as shown in FIGS. 3 and 4 could be located between the moving items 7 and the sensor I.

However, placing the pole piece assembly between the sensor I and the moving item 7 should not prevent the passage of field-disturbing members being detected, and this could occur if the gap between the disturbing members and the circuit becomes too great.

Figure 6:
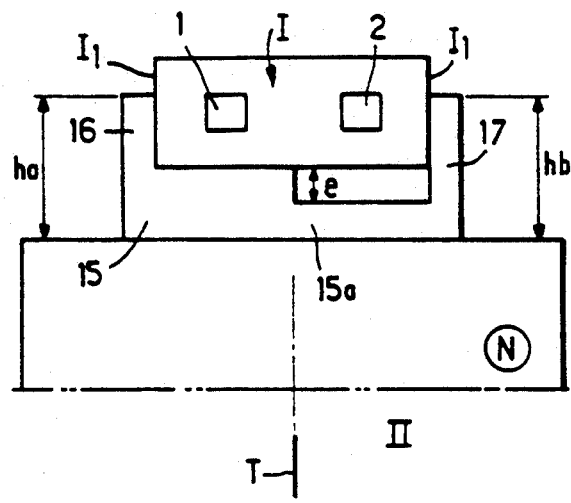
FIGS. 6, 6A, and 6B are elevation views of another variant embodiment of a sensor of the invention, showing how the invention operates.
Figure 7:
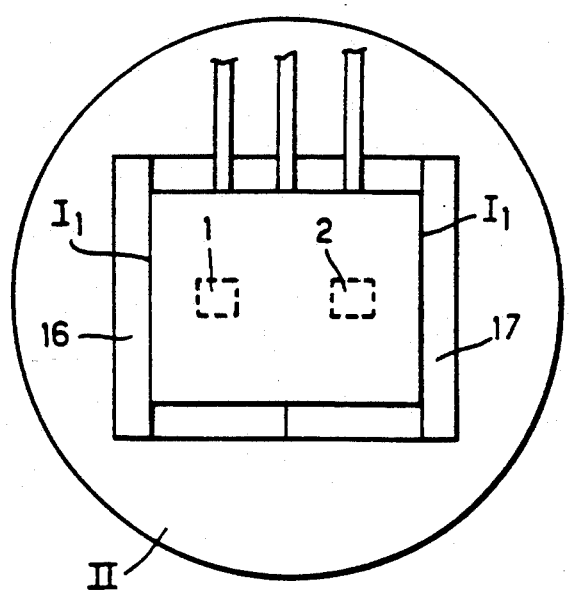
FIG. 7 is a plan view of the sensor shown in FIG. 6.

FIGS. 6 and 7 show a variant embodiment of the invention enabling large air gap detection properties to be conserved. In the example shown, the pole piece 15 described above is provided with two branches 16 and 17 projecting up from the base 15a and engaging opposite ends $I_1$ of the sensor, each of the branches extending over a determined height $h_a$, $h_b$ from the top face of the magnet II and the free ends of the branches. Advantageously, the branches 16 and 17 engage the opposite ends $I_1$ of the sensor perpendicularly to the axis passing between the two groups of probes 1 and 2. This pole piece is thus generally U-shaped and serves, in the absence of the cut-out 13a to make the induction through the central portion of the circuit containing the two groups of probe more uniform. The less uniform the induction that appears at the surface of the magnet, the more such uniformization is required. The heights $h_a$ and $h_b$ of the branches are determined to provide maximum uniformity of induction while avoiding any reduction in sensor sensitivity by reducing the air gap. Advantageously, the branches may be of different heights, so as to enhance the passage of the induction through one of the branches relative to the other. This disposition contributes, as does the cut-out 13a, to establishing an induction difference. One way of adjusting the bias induction is thus provided, i.e. selecting different heights for the branches 16 and 17.

Figure 2:
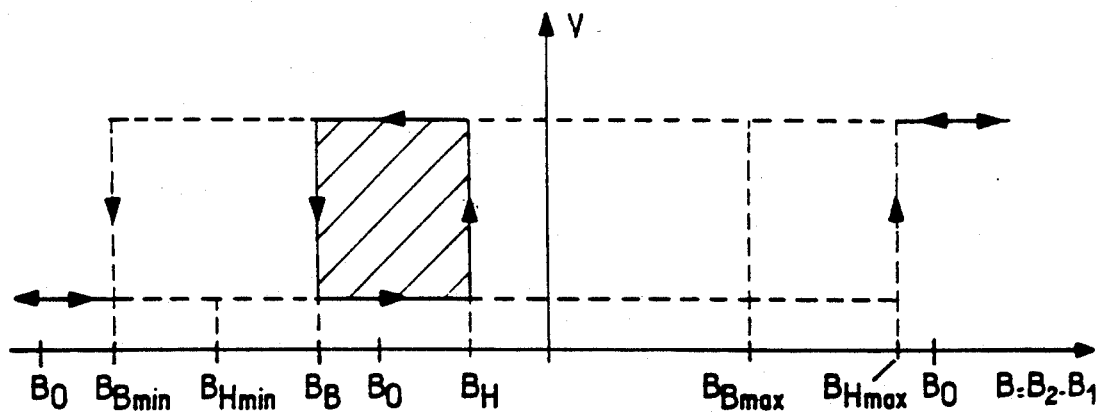
FIG. 2 is a graph showing the output signal from a Hall effect sensor as a function of the detected induction difference.
Figure 6A:
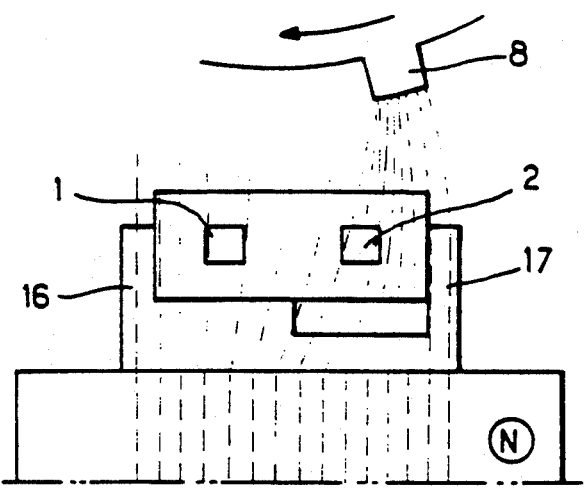
Figure 6B:
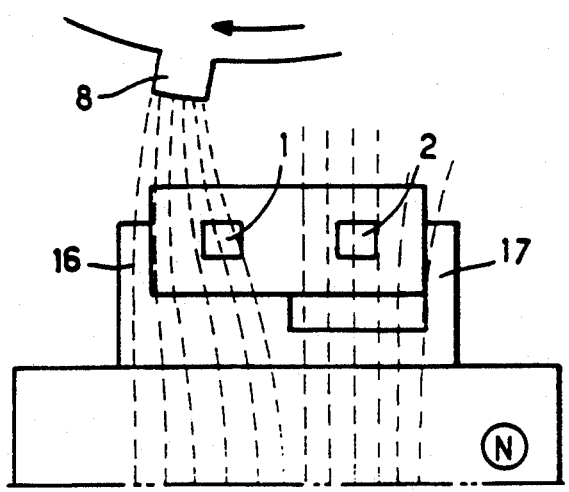

In the example shown in FIGS. 6, 6A, and 6B, the pole piece 15 enhances field propagation through the group of probes 1, such that the induction difference $B = B_2 - B_1$ is negative. The pole piece 15 is designed to achieve the condition in which the bias induction field $B_0$, i.e. in the present case negative $B_0$, is less than the hysteresis cycle. The output from the sensor is therefore in the low state (FIG. 2). If a disturbing member 8 moves close to the second group of probes 2, then the induction field lines are concentrated in the branch 17, and in particular they are concentrated in the second group of probes 2 located close to the branch 17 (FIG. 6A). Under such conditions, the resulting field B may be greater than the high threshold value $B_H$. The output from the sensor takes the high logic level. When the induction field disturbing member 8 comes close to the first group of probes 1, then the field lines concentrate in the branch 16 and thus in the first group of probes 1 (FIG. 6B). The resulting induction difference B can thus be below the value of the low switchover threshold $B_B$, thereby ensuring that the sensor switches to low logic level.

Figure 8:
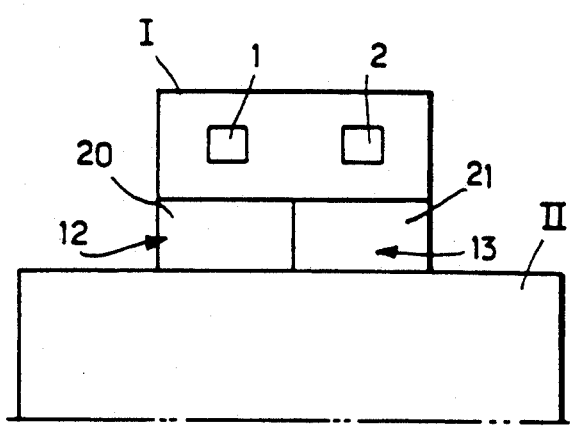
FIG. 8 is an elevation view showing another embodiment of the invention.

FIG. 8 shows another variant embodiment in which the pole piece assembly is constituted by two separate but contiguous pole pieces 20 and 21, each constituting a corresponding zone 12 or 13 of different given permeability. Naturally, the pole pieces may optionally be provided with pole branches 16 and 17 as described above.

Figure 9:
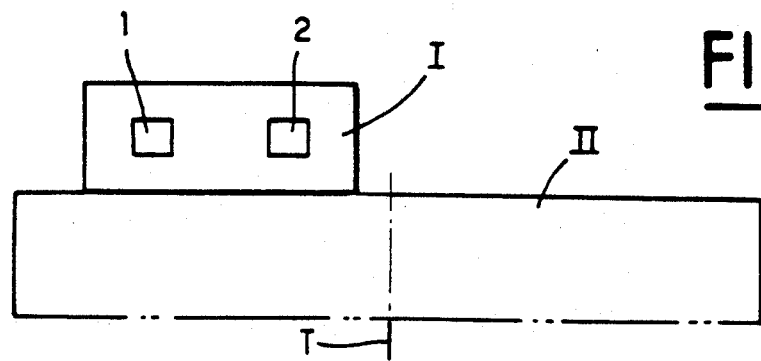
FIG. 9 is an elevation view showing another variant embodiment of the invention.

In the various embodiments illustrated above, it should be assumed that the axis of symmetry T of the magnet passes through the middle of the gap between the two groups of probes. Naturally, a second embodiment could be provided by off-centering the magnet II relative to the circuit I, thereby obtaining the bias induction difference $B_0$ in combination with the pole piece assembly. On the same lines, the circuit I could merely be off-centered relative to the magnet II so that it does not establish symmetrical induction, thereby also obtaining the bias induction $B_0$ (FIG. 9).

The invention is not limited to the examples described and shown, and various modifications may be made thereto without going beyond the scope of the invention.

We claim:

1. A differential detection Hall effect component, comprising:

first and second groups of Hall effect probes;

positioning means for positioning the two groups at locations spaced apart from each other;

pole means for subjecting the probes to induction fields which vary in response to movement of a field-disturbing member relative to the probes and which are created by at least one permanent magnet;

differential amplifier means for generating an induction difference signal representative of a detected induction difference between the two groups of probes;

a hysteresis level comparator;

means for applying the induction difference signal to the hysteresis level comparator to cause the comparator to generate a first logic signal in a first logic state when the detected induction difference is greater than a high switchover threshold and to generate a complementary logic signal in a second logic state when the detected induction difference is less than a low switchover threshold, wherein said pole means is arranged to subject the groups of probes, in the absence of field-disturbing members detectable by the probes to different respective ones of said induction fields so that a bias induction difference is present between the two groups in said absence of field-disturbing members, thereby obtaining logic signals in predetermined logic states at an output of the hysteresis level comparator in spite of induction difference dispersions in the component which lie between a minimum value of the low switchover threshold and a maximum value of the high switchover threshold.

2. A component as claimed in claim 1, wherein said bias induction difference is not less than the value of the high switchover threshold.

3. A component as claimed in claim 1, wherein said bias induction difference is not greater than a value of the low switchover threshold.

4. A component as claimed in claim 1, wherein said bias induction difference is greater than the low switchover threshold and less than the high switchover threshold.

5. A component as claimed in claim 1, wherein said pole means comprises a pole piece assembly and means defining a first zone in said assembly having a first predetermined magnetic permeability for subjecting the first group of probes to a first induction field, and a second zone contiguous with the first zone and having a second predetermined magnetic permeability different from the first predetermined magnetic permeability for subjecting the second group of probes to a second induction field, thereby obtaining the bias induction difference between the two groups of probes.

6. A component as claimed in claim 5, wherein the pole piece assembly constitutes an integral part of the component.

7. A component as claimed in claim 5, wherein the pole piece assembly is positioned between the permanent magnet which creates the induction fields and the two groups of probes.

8. A component as claimed in claim 5, wherein the pole piece is positioned between a path of field-disturbing members past the component and the groups of probes.

9. A component as claimed in claim 5, wherein the pole piece assembly comprises two contiguous but discrete pole pieces, each having a different predetermined magnetic permeability.

10. A component as claimed in claim 5, wherein the pole piece assembly includes branches extending, at least in part, over two opposite ends of an integrated circuit in which said groups of probes are positioned.

11. A component as claimed in claim 10, wherein each of the branches has a predetermined height different from that of the other branch.

12. A component as claimed in claim 5, wherein the pole piece assembly comprises a asymmetrical pole piece having an upstanding projecting portion which forms the first zone, and an adjacent cut-out forming the second zone.

13. A component as claimed in claim 5, wherein the second zone is an empty space adjacent the first zone.

14. A component as claimed in claim 5, wherein the pole piece assembly includes a pole piece made of a ferromagnetic material.

15. A component as claimed in claim 5, wherein the pole piece assembly includes a pole piece made of a ferromagnetic material.

16. A component as claimed in claim 1, wherein the pole means comprises means for positioning the groups of probes at a location offset relative to an axis of symmetry of the magnet which creates the induction fields.

17. A component as claimed in claim 1, further comprising means for locating the groups of probes at a position offset relative to an axis of symmetry of the magnet which creates the induction fields, and wherein the pole means comprises a pole piece which defines two zones of different magnetic permeabilities.

18. A Hall effect sensor, comprising a permanent magnet and a differential detection Hall effect component, comprising:

first and second groups of Hall effect probes;

positioning means for positioning the two groups at locations spaced apart from each other;

pole means for subjecting the probes to induction fields which vary in response to movement of a field-disturbing member relative to the probes and which are created by at least one permanent magnet;

differential amplifier means for generating an induction difference signal representative of a detected induction difference between the two groups of probes;

a hysteresis level comparator;

means for applying the induction difference signal to the hysteresis level comparator to cause the comparator to generate a first logic signal in a first logic state when the detected induction difference is greater than a high switchover threshold and to generate a complementary logic signal in a second logic state when the detected induction difference is less than a low switchover threshold, wherein said pole means is arranged to subject the groups of probes, in the absence of field-disturbing members detectable by the probes, to different respective ones of said induction fields so that a bias induction difference is present between the two groups in logic states at an output of the hysteresis level comparator in spite of induction difference dispersions in the component which lie between a minimum value of the low switchover threshold and a maximum value of the high switchover threshold.

* * * * *